(12) United States Patent
Otsuka

(10) Patent No.: US 9,368,227 B2
(45) Date of Patent: Jun. 14, 2016

(54) SEMICONDUCTOR DEVICE AND TEST METHOD

(71) Applicant: LAPIS Semiconductor Co., Ltd., Yokohama (JP)

(72) Inventor: Masayuki Otsuka, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 89 days.

(21) Appl. No.: 14/305,601

(22) Filed: Jun. 16, 2014

(65) Prior Publication Data
US 2014/0368226 A1 Dec. 18, 2014

(30) Foreign Application Priority Data
Jun. 17, 2013 (JP) .................................. 2013-126606

(51) Int. Cl.
*G01R 31/02* (2006.01)
*G11C 17/18* (2006.01)
*G11C 29/02* (2006.01)
*G01R 31/28* (2006.01)

(52) U.S. Cl.
CPC ............ *G11C 17/18* (2013.01); *G01R 31/2856* (2013.01); *G11C 29/027* (2013.01); *G01R 31/2853* (2013.01)

(58) Field of Classification Search
CPC .................. H01L 2924/0002; H01L 2924/00; G01R 31/07; G01R 31/316
USPC ..................................... 324/750.01, 507, 550
See application file for complete search history.

(56) References Cited

U.S. PATENT DOCUMENTS

2001/0034070 A1* 10/2001 Damon .................... H01L 22/34
438/14
2008/0122027 A1* 5/2008 Ueda .................... H01L 23/5256
257/529

FOREIGN PATENT DOCUMENTS

JP 2012-033232 A 2/2012

* cited by examiner

*Primary Examiner* — Vincent Q Nguyen
(74) *Attorney, Agent, or Firm* — Rabin & Berdo, P.C.

(57) ABSTRACT

A test voltage having a first voltage or a second voltage is applied to an output terminal of a complementary fuse that includes a first fuse to one end of which the first voltage is applied and the other end of which serves as the output terminal and a second fuse to one end of which the second voltage is applied and the other end of which is connected to the output terminal. The test voltage then stops being applied. In such a state, whether output data from the output terminal of the complementary fuse coincides with an expected value is determined. The result of determination is output as a test result.

7 Claims, 5 Drawing Sheets

SEMICONDUCTOR DEVICE AND TEST METHOD

BACKGROUND OF THE INVENTION (1) Field of the Invention

The present invention relates to a semiconductor device using a fuse as a storage element and a test method thereof.

(2) Description of the Related Art

More and more semiconductor devices are using fuses as nonvolatile storage elements. One of the methods for disconnecting a fuse includes irradiating the fuse with laser light to blow the fuse by the optical energy of the laser light. The optical energy of the irradiating laser light is adjusted to a level sufficient to blow the fuse. However, there has been the possibility of a disconnection failure that fuses other than the one to be disconnected are also disconnected due to a maladjustment of the optical energy or irradiation position of the laser light. Failures in which unintended fuses are disconnected can also occur due to various other factors. Examples thereof include a disconnection because of stress in manufacturing steps and melting in a chemical solution or other liquid. With such semiconductor devices using fuses, it is a challenge to check that fuses to be disconnected are electrically fully disconnected, i.e., correctly disconnected.

For example, expected values when fuses are correctly disconnected may be input from outside a semiconductor device. The expected values are compared with data read from the fuses to determine whether the fuses are correctly disconnected (for example, see Japanese Patent publication No. 2012-33232). Suppose that such a semiconductor device uses a complementary fuse in which two fuses are connected in series and the connection node serves as an output terminal. If the two fuses are both disconnected, neither a power supply voltage (hereinafter, referred to as "1") nor a ground potential (hereinafter, referred to as "0") is supplied to the output terminal of the complementary fuse. The value read from the output terminal of the complementary fuse is not stably fixed to either "1" or "0," and may become floating. If the data output from the complementary fuse happens to coincide with the expected value at the time of a shipping test, the semiconductor device can pass the shipping test and be shipped out. Since the complementary fuse may output data having a value different from written one afterwards, such a semiconductor device can, in the worst case, cause a problem of an apparatus on which the semiconductor device is mounted.

SUMMARY OF THE INVENTION

An object of the present invention is to provide a semiconductor device and a test method capable of detecting a disconnection failure of a complementary fuse.

A semiconductor device according to the present invention includes: a fuse circuit including at least one complementary fuse; a test voltage application circuit; and a comparison circuit, the complementary fuse including a first fuse to one end of which a first voltage is applied and the other end of which serves as an output terminal and a second fuse to one end of which a second voltage is applied and the other end of which is connected to the output terminal, the test voltage application circuit is configured to apply a test voltage having the first voltage or the second voltage to the output terminal of the complementary fuse and then stop applying the test voltage, the comparison circuit is configured to determine, after the test voltage application circuit stops applying the test voltage, whether or not output data from the output terminal of the complementary fuse coincides with an expected value, and output the result of determination as a test result.

A test method of a semiconductor device according to the present invention is a test method of a semiconductor device including a complementary fuse that includes a first fuse to one end of which a first voltage is applied and the other end of which serves as an output terminal and a second fuse to one end of which a second voltage is applied and the other end of which is connected to the output terminal, the test method including: performing a first test sequence and a second test sequence in succession, the first test sequence including applying a test voltage having the first voltage to the output terminal of the complementary fuse and then obtaining a first comparison result by comparing whether output data from the output terminal of the complementary fuse coincides with an expected value, the second test sequence including applying the test voltage having the second voltage to the output terminal of the complementary fuse and then obtaining a second comparison result by comparing whether the output data from the output terminal of the complementary fuse coincides with the expected value; and outputting a test result indicating a conforming item if the first comparison result and the second comparison result both indicate coincidence, and outputting the test result indicating a defective item if the first or second comparison result indicates non-coincidence.

DETAILED DESCRIPTION OF THE PREFERRED EMBODIMENT

A configuration of a semiconductor device according to the present invention will be described in detail below with reference to the drawings.

Figure 1:
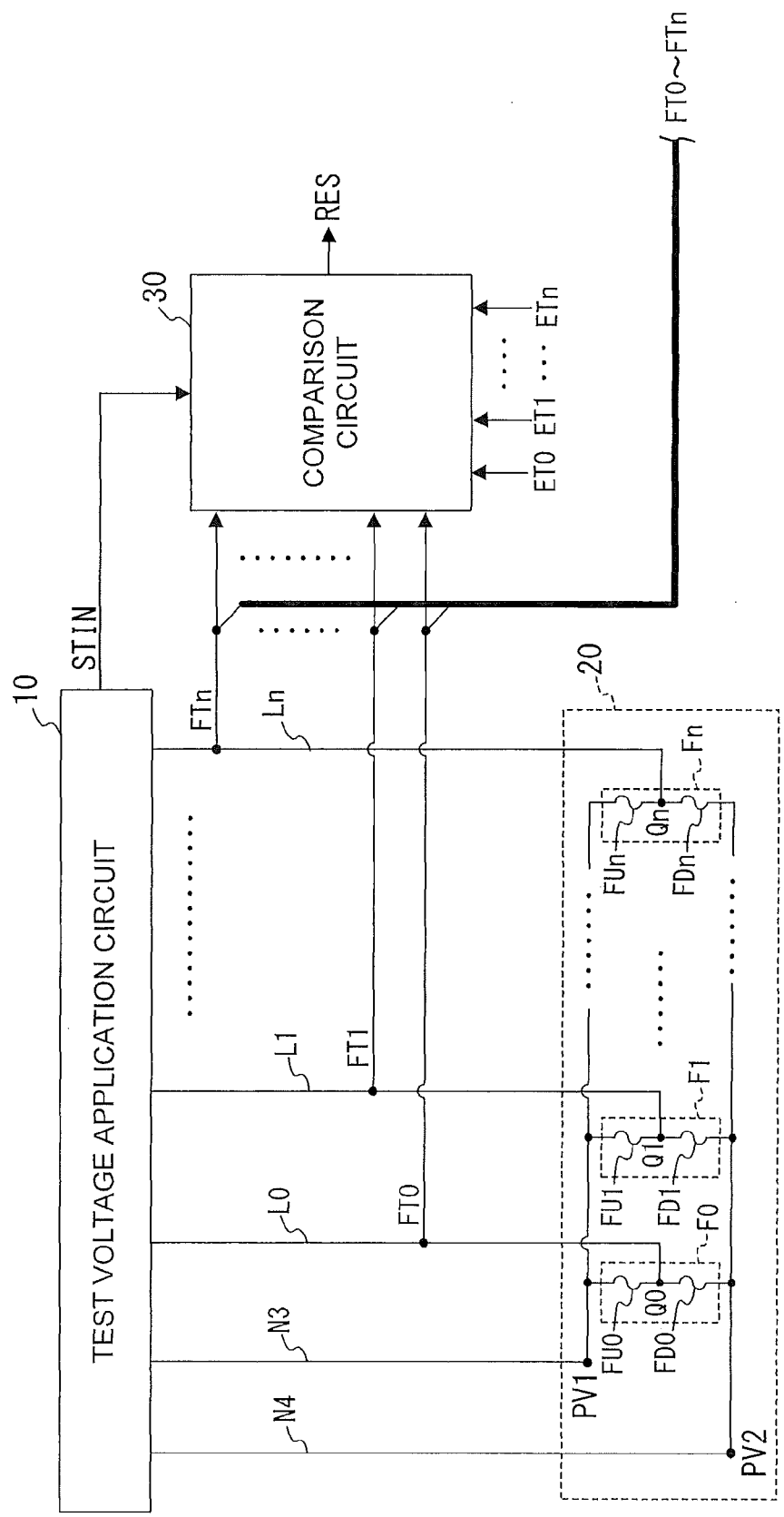
FIG. 1 is a block diagram showing part of a configuration of a semiconductor device according to the present invention.

FIG. 1 is a block diagram showing an example of a semiconductor device 5 according to the present invention. The semiconductor device 5 includes a test voltage application circuit 10, a fuse circuit 20, and a comparison circuit 30. The test voltage application circuit 10 has n data output lines Lj (j=0, 1, . . . , n). n is a positive integer.

The test voltage application circuit 10 applies various test voltages (to be described later) to each of the data output lines Lj at timing according to test sequences (to be described later) in response to a test start signal supplied from outside. The test voltage application circuit 10 supplies a strobe signal STIN to the comparison circuit 30 at timing according to the test sequences. The strobe signal STIN prompts the comparison circuit 30 to perform a comparison operation. The test voltage application circuit 10 applies a first voltage to a data voltage input terminal PV1 of the fuse circuit 20 via a power supply line N3. An example of the first voltage is a power supply voltage VDD. The test voltage application circuit 10 applies a second voltage lower than the first voltage to a data voltage input terminal PV2 of the fuse circuit 20 via a power supply line N4. An example of the second voltage is a ground potential VSS. Hereinafter, a state of being at the first voltage will be referred to as "1", and a state of being at the second voltage as "0."

The fuse circuit 20 is configured so that (n+1) complementary fuses Fj (j=0, 1, . . . , n) serving as (n+1) bits of storage elements are connected in parallel. The complementary fuses Fj each include a pair of fuses FUj and FDj (j=0, 1, . . . , n) connected in series. The fuses FUj and FDj are connected to each other at one end each. The connection node serves as an output terminal Qj (j=0, 1, . . . , n) of the complementary fuse Fj. The other ends of the fuses FUj are connected to the data voltage input terminal PV1 in common. The other ends of the fuses FDj are connected to the data voltage input terminal PV2 in common. In the fuse circuit 20, the complementary fuses Fj each serve to store one bit of data. Either one of a pair of fuses (FUj and FDj) is disconnected to store data "0" or "1." For example, only the fuse FUj in a pair of fuses FUj and FDj is disconnected to store one bit of data "0" in the complementary fuse Fj. Only the fuse FDj in a pair of fuses FUj and FDj is disconnected to store one bit of data "1" in the complementary fuse Fj. The (n+1) bits of data stored in the (n+1) complementary fuses Fj is supplied as fuse data FTj (j=0, 1, . . . , n) to the comparison circuit 30 and various circuits (not shown) that use the fuse data FTj, via the respective data output lines Lj (j=0, 1, . . . , n). The comparison circuit 30 determines whether the values of the (n+1) bits of fuse data FTj coincide with their expected values ETj (j=0, 1, . . . , n), and outputs a test result signal RES indicating the result of determination. If the values coincide, the comparison circuit 30 outputs a test result signal RES indicating that the fuse circuit 20 is a "conforming item." If the values differ from each other, the comparison circuit 30 outputs a test result signal RES indicating that the fuse circuit 20 is a "defective item." The expected values ETj are obtained, for example, by converting an expected value bit sequence input from outside in a serial form into a parallel form by using a built-in shift register (not shown).

Next, a disconnection failure test of the fuse circuit 20 to be performed by the test voltage application circuit 10 and the comparison circuit 30 will be described.

The test voltage application circuit 10 initially performs a voltage application operation according to a first test sequence in response to a test start command signal supplied via an external terminal. The first test sequence is performed to determine that the fuse circuit 20 is a "defective item" if the fuse circuit 20 includes a disconnection-failed complementary fuse Fj for an expected value of "0." The first test sequence will be described below.

The test voltage application circuit 10 applies a first test voltage to all the data output lines Lj for a predetermined precharge period. The first test voltage has the same voltage value as that of the first voltage applied to the data voltage input terminal PV1 of the fuse circuit 20 (for example, VDD). The application of the first test voltage charges parasitic capacitances of the data output lines Lj and the output terminals Qj formed on the semiconductor, whereby the voltage values on the data output lines Lj become the same as that of the first test voltage. After the application of the first test voltage for the precharge period, the test voltage application circuit 10 stops application of the voltage to all the data output lines Lj. As a result, the fuse circuit 20 applies voltages according to the disconnection states of the pairs of fuses (FUj and FDj), i.e., voltages corresponding to the written data to the respective data output lines Lj. In such a state, the test voltage application circuit 10 supplies the strobe signal STIN to the comparison circuit 30. According to the strobe signal STIN, the comparison circuit 30 determines whether the values of the fuse data FTj coincide with their expected values ETj.

If the values coincide, the comparison circuit 30 obtains a first test result indicating a "conforming item" since the data is correctly written in the fuse circuit 20. If the values do not coincide, the comparison circuit 20 obtains a first test result indicating a "defective item" since the data is incorrectly written in the fuse circuit 20.

If "0" is correctly written in the complementary fuse F0, only the fuse FU0 of the fuses FU0 and FD0 in the complementary fuse F0 is disconnected. In the complementary fuse F0, the second voltage (for example, VSS) is applied to the output terminal Q0 via the fuse FD0. Consequently, fuse data FT0 indicating "0" corresponding to the second voltage is read from the complementary fuse F0. If "1" is correctly written in the complementary fuse F1, only the fuse FD1 of the fuses FU1 and FD1 in the complementary fuse F1 is disconnected. In the complementary fuse F1, the first voltage (for example, VDD) is applied to the output terminal Q1 via the fuse FU1. Consequently, fuse data FT1 indicating "1" corresponding to the first voltage is read from the complementary fuse F1.

If only one of a pair of fuses (FUj and FDj) is disconnected, the fuse data FTj read from the complementary fuse Fj coincides with the expected value ETj. In such a case, the comparison circuit 30 obtains a first test result indicating that the complementary fuse Fj is a "conforming item."

Now, take the case of a disconnection failure in which a pair of fuses (FUj and FDj) are both disconnected. The output terminal Qj of the complementary fuse Fj is in a high impedance state, i.e., an unstable state where the output value does not stay at either one of "0" and "1." For example, suppose that both the fuses FUn and FDn are accidentally disconnected when writing "0" into the complementary fuse Fn. In a test at the time of product shipping, fuse data FTn having the same value as the value "0" indicated by the expected value ETn may happen to be read from the complementary fuse Fn. The complementary fuse Fn can thus be erroneously determined to be a "conforming item" since the value of the read fuse data FTn coincides with the value "0" indicated by the expected value ETn despite the disconnection failure of the complementary fuse Fn.

To detect the disconnection failure like this as a data write error, the first test sequence applies the first voltage (for example, VDD) to all the data output lines Lj in the precharge period immediately before the comparison of the fuse data FTj read from the fuse circuit 20 with the expected values ETj.

If a complementary fuse Fn is in a disconnection-failed state, the pair of fuses FUn and FDn are both disconnected. No voltage will be applied to the data output line Ln via the fuse FUn or FDn. As a result, the state of the first test voltage with which the parasitic capacitances of the data output line Ln and the output terminal Qn are charged in the precharge period is maintained even after the precharge period. Consequently, fuse data FTn indicating "1" is read from the disconnection-failed complementary fuse Fn as the data corresponding to the first test voltage after the precharge period. When the strobe signal STIN is supplied from the test voltage application circuit 10 after the precharge period, the comparison circuit 30 determines that the complementary fuse Fn is a "defective item" since the value "1" of the fuse data FTn does not coincide with "0" indicated by the expected value ETn.

According to the foregoing first test sequence, a "defective item" determination can be reliably made if the expected value for a disconnection-failed complementary fuse Fj where the pair of fuses (FUj and FDj) are both disconnected is "0."

Next, the text voltage application circuit 10 performs a voltage application operation according to a second test sequence. The second test sequence is performed to determine that the fuse circuit 20 is a "defective item" if the fuse circuit 20 includes a disconnection-failed complementary fuse Fj for an expected value of "1." The second test sequence will be described below.

The test voltage application circuit 10 applies a second test voltage (for example, VSS) to all the data output lines Lj for a predetermined precharge period. The second test voltage has the same voltage value as that of the second voltage applied to the data voltage input terminal PV2 of the fuse circuit 20. The application of the second test voltage discharges the parasitic capacitances of the data output lines Lj and the output terminals Qj formed on the semiconductor, whereby the voltage values on the data output lines Lj become the same as that of the second test voltage. After the application of the second test voltage for the precharge period, the test voltage application circuit 10 stops applying the voltage to all the data output lines Lj. As a result, the fuse circuit 20 applies the voltages according to the disconnection states of the pairs of fuses (FUj and FDj), i.e., the voltages corresponding to the written data to the respective data output lines Lj. In such a state, the test voltage application circuit 10 supplies the strobe signal STIN to the comparison circuit 30. According to the strobe signal STIN, the comparison circuit 30 determines whether the values of the fuse data FTj coincide with their expected values ETj. If the values coincide, the comparison circuit 30 obtains a second test result indicating a "conforming item" since the data is correctly written in the fuse circuit 20. If the values do not coincide, the comparison circuit 30 obtains a second test result indicating a "defective item" since the data is incorrectly written in the fuse circuit 20.

For example, if "0" is correctly written in the complementary fuse F0, only the fuse FU0 of the fuses FU0 and FD0 in the complementary fuse F0 is disconnected. In the complementary fuse F0, the second voltage (for example, VSS) is applied to the output terminal Q0 via the fuse FD0. Fuse data FT0 indicating "0" corresponding to the second voltage is thus read from the complementary fuse F0. If "1" is correctly written in the complementary fuse F1, only the fuse FD1 of the fuses FU1 and FD1 in the complementary fuse F1 is disconnected. In the complementary fuse F1, the first voltage (for example, VDD) is applied to the output terminal Q1 via the fuse FU1. Fuse data FT1 indicating "1" corresponding to the first voltage is thus read from the complementary fuse F1.

The second test sequence applies the second voltage (for example, VSS) to all the data output lines Lj in the precharge period immediately before the comparison of the fuse data FTj read from the fuse circuit 20 with the expected values ETj.

If a complementary fuse Fn is in a disconnection-failed state, the pair of fuses FUn and FDn are both disconnected. No voltage will be applied to the data output line Ln via the fuse FUn or FDn. As a result, the state of the second test voltage with which the parasitic capacitances of the data output line Ln and the output terminal Qn are charged in the precharge period is maintained even after the precharge period. Consequently, fuse data FTn indicating "0" is read from the disconnection-failed complementary fuse Fn as the data corresponding to the second test voltage after the precharge period. When the strobe signal STIN is supplied from the test voltage application circuit 10 after the precharge period, the comparison circuit 30 determines that the complementary fuse Fn is a "defective item" since the value "0" of the fuse data FTn does not coincide with "1" indicated by the expected value ETn.

According to such a second test sequence, a "defective item" determination can be reliably made if the expected value for a disconnection-failed complementary fuse Fj where the pair of fuses (FUj and FDj) are both disconnected is "1."

According to the foregoing first and second test sequences, a disconnection-failed complementary fuse Fj where the pair of fuses (FUj and FDj) are both disconnected can be determined to be a "defective item."

The comparison circuit 30 determines whether the first test result obtained by the first test sequence and the second test result obtained by the second test sequence both indicate coincidence with the expected values. If both the test results indicate coincidence, the comparison circuit 30 outputs the test result signal RES indicating a "conforming item." If either one of the test results indicates non-coincidence, the comparison circuit 30 outputs the test result signal RES indicating a "defective item."

Figure 2:
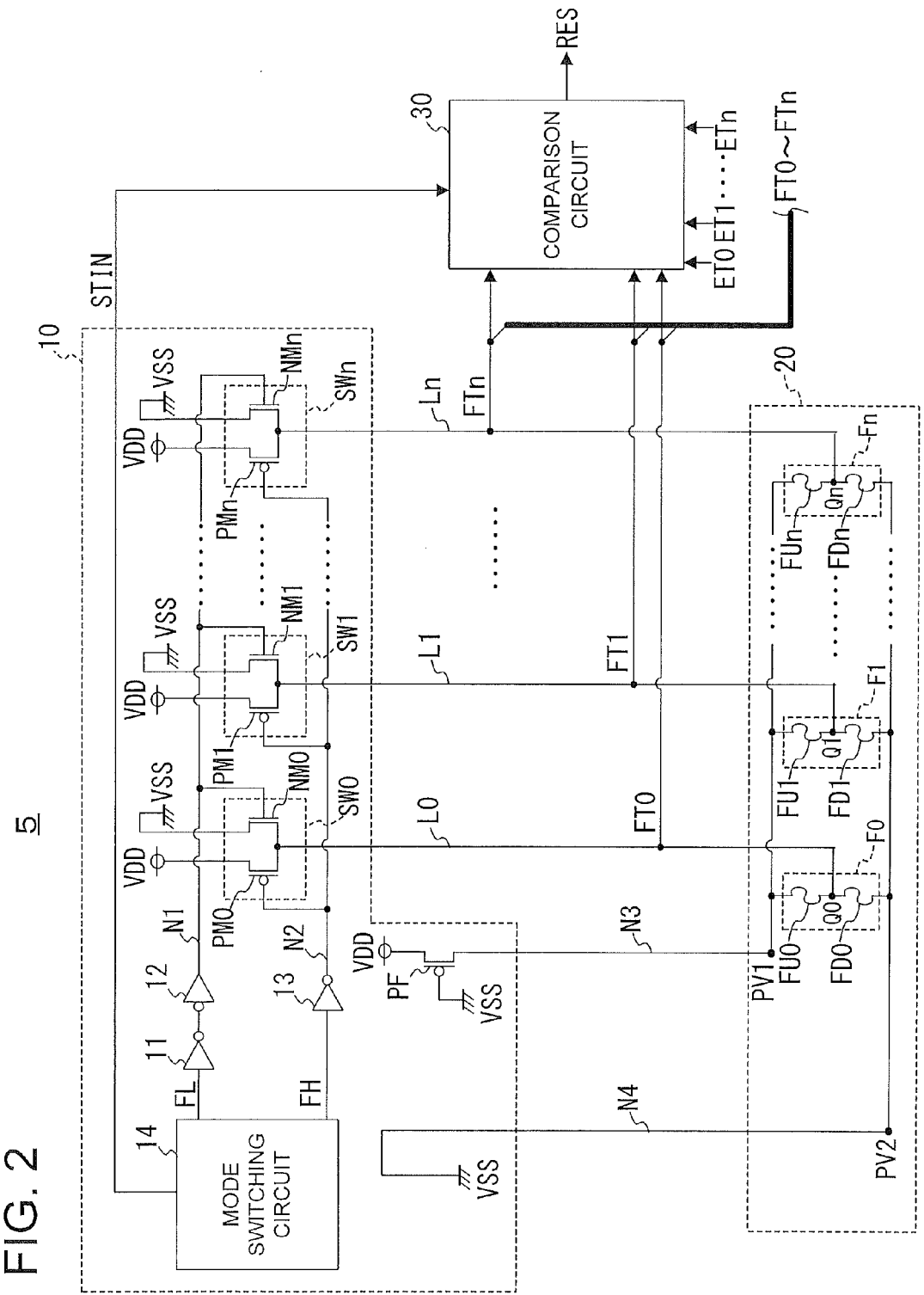
FIG. 2 is a circuit diagram showing an internal configuration of the semiconductor device.

FIG. 2 is a circuit diagram showing an example of circuits formed on the semiconductor device 5 according to the present invention. The semiconductor device 5 includes the test voltage application circuit 10, the fuse circuit 20, and the comparison circuit 30.

The test voltage application circuit 10 includes inverter circuits 11 to 13, a mode switching circuit 14, switch circuits SWj (j=0, 1, 2, . . . , n), and a P-channel metal oxide semiconductor (MOS) transistor (hereinafter, referred to as a PMOS element) PF. The mode switching circuit 14 outputs mode switching signals FL and FH, for example, according to a test start command from outside the semiconductor device 5. The mode switching signals FL and FH are voltages corresponding to operations in respective test modes. The mode switching signal FL is sent to a voltage control line N1 via the two inverter circuits 11 and 12 connected in series. The mode switching signal FH is supplied to the inverter circuit 13. The inverter circuit 13 sends an inverted signal obtained by inverting the mode switching signal FH to a voltage control line N2.

The test voltage application circuit 10 includes the switch circuits SWj which correspond to the data output lines Lj, respectively. More specifically, the switch circuits SWj include PMOS elements PMj (j=0, 1, 2, . . . , n) and N-channel MOS transistors (hereinafter, referred to as NMOS elements) NMj (j=0, 1, 2, . . . , n). The gates of the PMOS elements PMj are connected to the voltage control line N2. The gates of the NMOS elements NMj are connected to the voltage control line N1. The power supply voltage VDD is applied to the sources of the PMOS elements PMj. The ground potential VSS is applied to the sources of the NMOS elements NMj. The drains of the PMOS elements PMj are connected to those of the NMOS elements NMj, respectively. The power supply voltage VDD is applied to the source of the PMOS element PF. The ground potential VSS is applied to the gate of the PMOS element PF. The drain of the PMOS element PF is connected to the data voltage input terminal PV1 of the fuse circuit 30 via the power supply line N3. The ground potential VSS is applied to the data voltage input terminal PV2 via the power supply line N4.

The configuration and operation of the fuse circuit 20 and the comparison circuit 30 shown in FIG. 2 are the same as those shown in FIG. 1. A description thereof is thus omitted.

Next, the operation of the configuration shown in FIG. 2 will be described.

Figure 3:
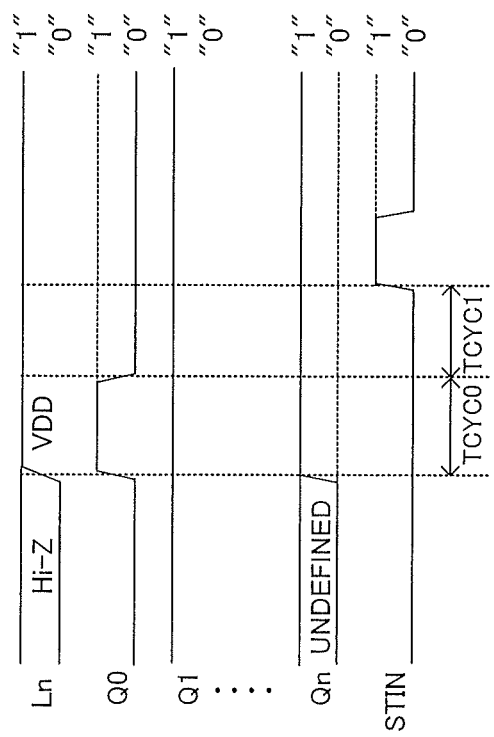
FIG. 3 is a time chart showing a first test sequence.

In the first test sequence, the mode switching circuit 14 initially fixes both the mode switching signals FL and FH to "0." Next, the mode switching circuit 14 sets the mode switching signal FH to "1" for a precharge period TCYC0 such as shown in FIG. 3, and then to "0" in and after the subsequent comparison wait period TCYC1. During the precharge period TCYC0, all the PMOS elements PMj of the switch circuits SWj are turned on. As shown in FIG. 3, the power supply voltage VDD serving as the first test voltage is thus applied to all the data output lines Lj. In and after the comparison wait period TCYC1, all the switch circuits SWj are turned off. No voltage is thus applied from the test voltage application circuit 10 side to the data output lines Lj. After the comparison wait period TCYC1, the mode switching circuit 14 supplies the strobe signal STIN for prompting the execution of a comparison operation to the comparison circuit 30.

In the first test sequence, a "1" error detection mode for detecting a "1" error is performed. The "1" error refers to that "1" is output from the output terminal of a complementary fuse Fj despite an expected value of "0."

Figure 4:
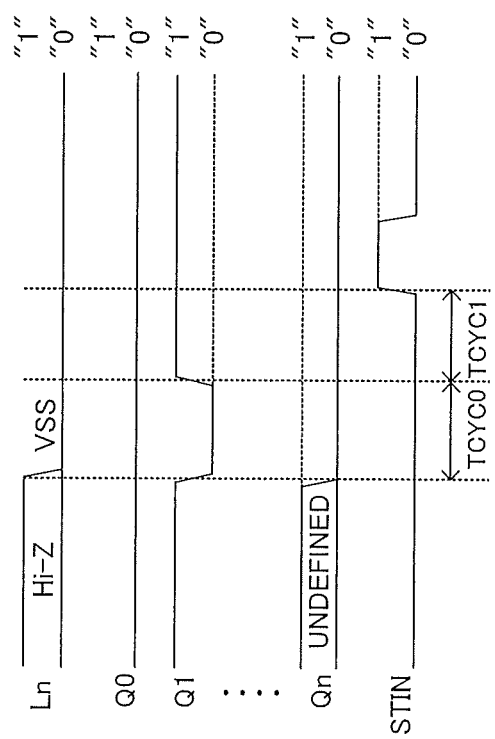
FIG. 4 is a time chart showing a second test sequence.

In the second test sequence, the mode switching circuit 14 initially fixes both the mode switching signals FL and FH to "0." Next, the mode switching circuit 14 sets the mode switching signal FL to "1" for a precharge period TCYC0 such as shown in FIG. 4, and then to "0" in and after the subsequent comparison wait period TCYC1. During the precharge period TCYC0, all the NMOS elements NMj of the switch circuits SWj are turned on. As shown in FIG. 4, the ground potential VSS serving as the second test voltage is thus applied to all the data output lines Lj. In and after the comparison wait period TCYC1, all the switch circuits SWj are turned off. No voltage is thus applied from the test voltage application circuit 10 side to the data output lines Lj. After the comparison wait period TCYC1, the mode switching circuit 14 supplies the strobe signal STIN for prompting the execution of a comparison operation to the comparison circuit 30.

In the second test sequence, a "0" error detection mode for detecting a "0" error is performed. The "0" error refers to that "0" is output from the output terminal of a complementary fuse Fj despite an expected value of "1."

A test operation according to the first test sequence will be described below by extracting only the complementary fuses F0, F1, and Fn among the complementary fuses Fj.

Suppose that the complementary fuse F0 is in a state where only the fuse FD0 in the pair of fuses FU0 and FD0 is disconnected, i.e., where data "1" is written. Suppose that the complementary fuse F1 is in a state where only the fuse FU1 in the pair of fuses FU1 and FD1 is disconnected, i.e., where data "0" is written. Suppose that the complementary fuse Fn is in a disconnection-failed state where the pair of fuses FUn and FDn are both accidentally disconnected when writing data "0."

The fuse data FTj has values corresponding to the fuse disconnection. The fuse data FT0 is "1." The fuse data FT1 is "0." During the precharge period TCYC0, all the pieces of fuse data FTj are forcefully set to "1." After the lapse of the comparison wait period TCYC1, the fuse data FT0 and FT1 returns to the values corresponding to the disconnection states of the respective fuses. The fuse data FT0 and FT1 is thus determined to coincide with the expected values when compared after the lapse of the comparison wait period TCYC1. The complementary fuse Fn is in an undefined state. The fuse data FTn is not fixed to either "0" or "1." The first test voltage applied to the data output lines Lj in the precharge period TCYC0 brings the complementary fuse Fn into the state of retaining "1." Such retention is caused by charging or discharging the parasitic capacitances of the output terminal Qn of the complementary fuse Fn and the data output line Ln. After the end of the subsequent comparison wait period TCYC1, the comparison circuit 30 compares the fuse data FTj with the expected values according to the strobe signal STIN supplied from the mode switching circuit 14. The fuse data FT0 and FT1 coincides with the respective expected values. The fuse data FTn retains "1," which does not coincide with the expected value of "0." The test result signal RES of the comparison circuit 30 indicates a "defective item," and the semiconductor device 5 with the disconnection-failed fuse can be prevented from shipping.

A test operation according to the second test sequence will be described below by extracting only the complementary fuses F0, F1, and Fn among the complementary fuses Fj.

Suppose that the complementary fuse F0 is in a state where only the fuse FD0 in the pair of fuses FU0 and FD0 is disconnected, i.e., where data "1" is written. Suppose that the complementary fuse F1 is in a state where only the fuse FU1 in the pair of fuses FU1 and FD1 is disconnected, i.e., where data "0" is written. Suppose that the complementary fuse Fn is in a disconnection-failed state where the pair of fuses FUn and FDn are both accidentally disconnected when writing data "1."

The fuse data FTj has values corresponding to the fuse disconnection. The fuse data FT0 is "1." The fuse data FT1 is "0." During the precharge period TCYC0, all the pieces of fuse data FTj are forcefully set to "0." After the lapse of the comparison wait period TCYC1, the fuse data FT0 and FT1 returns to the values corresponding to the disconnection states of the respective fuses. The fuse data FT0 and FT1 is thus determined to coincide with the expected values when compared after the lapse of the comparison wait period TCYC1.

The complementary fuse Fn is in an undefined state. The fuse data FTn is not fixed to either "0" or "1." The second test voltage applied to the data output lines Lj in the precharge period TCYC0 brings the complementary fuse Fn into the state of retaining "0." After the end of the subsequent comparison wait period TCYC1, the comparison circuit 30 compares the fuse data FTj with the expected values according to the strobe signal STIN supplied from the mode switching circuit 14. The fuse data FT0 and FT1 coincides with the respective expected values. The fuse data FTn retains "0," which does not coincide with the expected value of "1." Consequently, the test result signal RES of the comparison circuit 30 indicates a "defective item," and the semiconductor device 5 with the disconnection-failed fuse can be prevented from shipping.

The comparison circuit 30 determines whether the test result obtained by the first test sequence and the test result obtained by the second test sequence both indicate coincidence with the expected values. If both the results indicate coincidence, the comparison circuit 30 outputs the test result signal RES indicating a "conforming item." If either one of the results indicates non-coincidence, the comparison circuit 30 outputs the test result signal RES indicating a "defective item."

Figure 5:
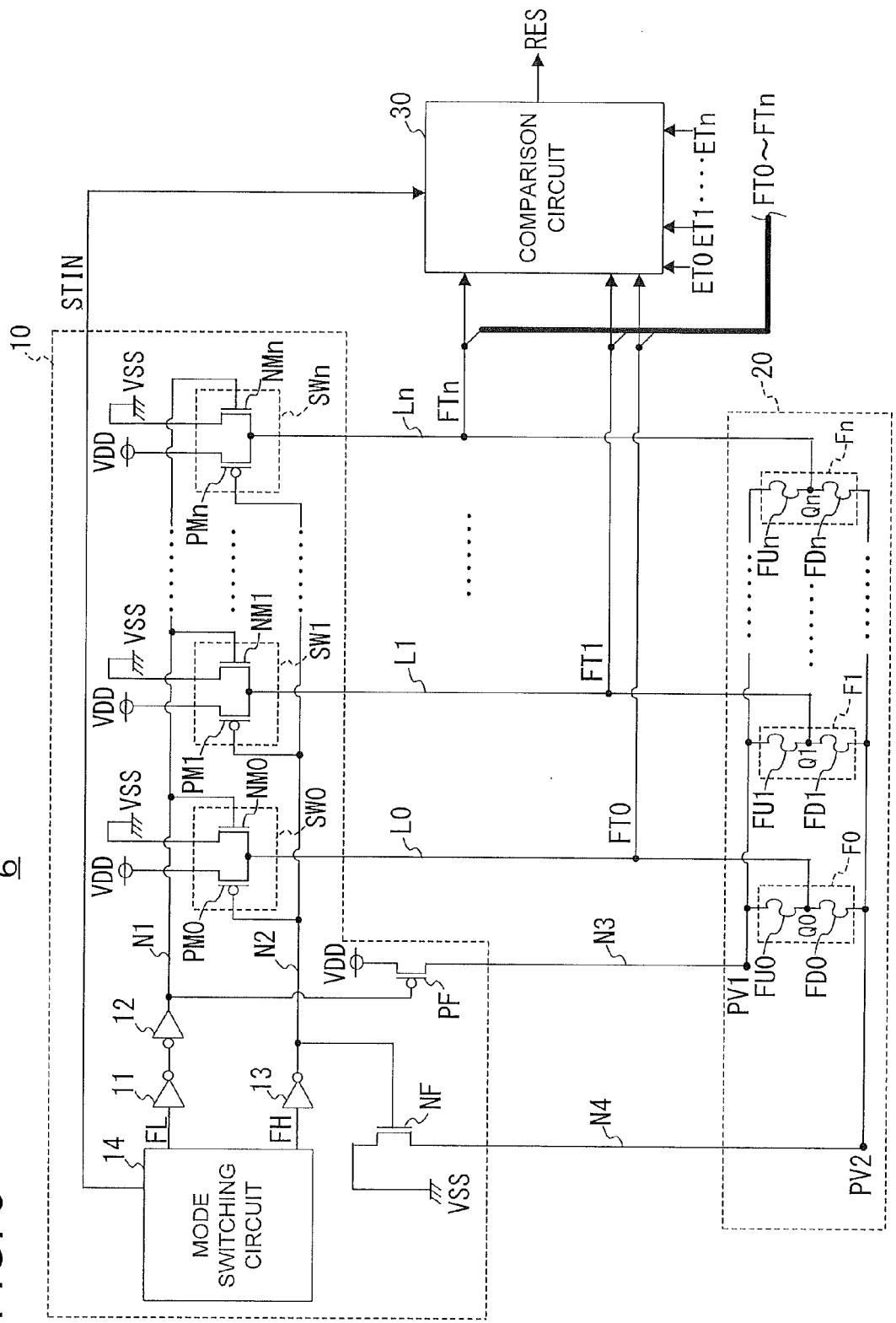
FIG. 5 is a circuit diagram showing the configuration of a semiconductor device according to another embodiment of the present invention.

In the foregoing embodiment, the power supply voltage VDD (in the case of the "1" error detection mode) or the ground potential VSS (in the case of the "0" error detection mode) is applied to the data output line Lj by the switch circuits SWj during the precharge period TCYC0. In the "1" error detection mode, the turning-on of the PMOS elements PMj can pass an unnecessary flow-through current through the PMOS elements PMj and the fuses FDj depending on the disconnection of the complementary fuses. In the foregoing embodiment, an unnecessary flow-through current flows through the PMOS element PM0 and the fuse FD0. In the "0" error detection mode, the turning-on of the NMOS elements NMj can pass an unnecessary flow-through current through the fuses FUj and the PMOS element PF depending on the disconnection of the complementary fuses. In the foregoing embodiment, an unnecessary flow-through current flows through the fuse FU1 and the PMOS element PF. FIG. 5 shows an embodiment where measures are taken to reduce such unnecessary flow-through currents.

The embodiment of FIG. 5 differs from that of FIG. 2 in the following points. The gate of the PMOS element PF of the test voltage application circuit 10 is connected to the voltage control line N1. The test voltage application circuit 10 further includes an NMOS element NF. The drain of the NMOS element NF is connected to the data voltage input terminal PV2 via the power supply line N4. The source of the NMOS element NF is grounded. In the "1" error detection mode, the PMOS elements PMj are turned on during the precharge period TCYC0. Since the NMOS element NF is turned off, no unnecessary flow-through current flows through the PMOS elements PMj and the NMOS element NF. In the "0" error detection mode, the NMOS elements NMj are turned on. Since the PMOS element PF is turned off, no unnecessary flow-through current flows through the PMOS element PF and the fuses FUj. Unlike the foregoing embodiment, no unnecessary current flows in the present embodiment. The effect of reducing power consumption can thus be expected.

The period when the first or second test voltage is applied, i.e., the precharge period TCYC0 may be set to any time longer than the time in which the test voltage charges or discharges the parasitic capacitances on the output terminals Qj of the complementary fuses Fj until the fuse data FTj reaches a stable voltage.

In the foregoing embodiments, the period from when the application of the first or second test voltage is stopped to when the comparison circuit 30 starts a comparison operation, i.e., the comparison wait period TCYC1 may be set to any time longer than the time in which the fuse data FTj stably returns to the states corresponding to the disconnection states of the respective fuses after the application of the test voltage by the test voltage application circuit 10.

The fuses used in the foregoing embodiments may be made of, for example, copper, polysilicon, etc. Alternatively, Zener zap fuses may be used.

According to the foregoing embodiments, not only defective items in which both fuses FUj and FDj are disconnected but also ones in which either one of the fuses is inappropriately disconnected and in which neither of the fuses FUj and FDj is disconnected can be determined to be "defective items."

In the foregoing embodiments, the comparison circuit 30 determines whether the fuse circuit 20 is a conforming item by comparing the fuse data FTj with the expected values ETj. However, such a disconnection failure can be detected without the comparison with the expected values ETj.

For example, whether the values of the fuse data FTj obtained by performing a test according to the first test sequence (FIG. 3) coincide with those of the fuse data FTj obtained by performing a test according to the second test sequence (FIG. 4) may be determined to detect a disconnection failure. If there is a disconnection failure, the fuse data FTj retains the voltage value applied in the precharge period TCYC0. The presence of a disconnection failure can thus be determined if there is a difference between the pieces of fuse data FTj obtained by the first and second test sequences using the different application voltages.

As described above, the semiconductor device (5) according to the present invention tests a complementary fuse (F) including a first fuse (FU) to one end of which the first voltage (VDD) is applied and the other end of which serves as an output terminal (Q) and a second fuse (FD) to one end of which the second voltage (VSS) is applied and the other end of which is connected to the output terminal in the following manner. A test voltage having the first voltage or the second voltage is applied to the output terminal (Q) of the complementary fuse. The application of the test voltage is then stopped. In such a state, the comparison circuit determines whether output data from the output terminal of the complementary fuse coincides with an expected value, and outputs the result of determination as a test result. According to such a test, the comparison circuit can detect non-coincidence between the fuse data of the complementary fuse and the expected value even in the event of a disconnection failure of the complementary fuse where the pair of fuses (FU and FD) are both disconnected. This allows a reliable defect determination.

This application is based on a Japanese Patent application No. 2013-126606 which is hereby incorporated by reference.

What is claimed is:

1. A semiconductor device comprising:
   a fuse circuit including a complementary fuse;
   a test voltage application circuit; and
   a comparison circuit, wherein
   the complementary fuse includes
     a first fuse, to one end of which a first voltage is applied and the other end of which serves as an output terminal, and
     a second fuse, to one end of which a second voltage is applied and the other end of which is connected to the output terminal,
   the first and second fuses being connected in series, the complementary fuse storing one bit of data when one of the first and second fuses is disconnected,
   the test voltage application circuit is configured to apply a test voltage having the first voltage or the second voltage to the output terminal of the complementary fuse and then stop applying the test voltage, and
   the comparison circuit is configured to determine, after the test voltage application circuit stops applying the test voltage, whether or not output data from the output terminal of the complementary fuse coincides with an expected value, and output a result of the determination as a test result.

2. The semiconductor device according to claim 1, wherein:
   the test voltage application circuit is configured to perform a first test sequence and a second test sequence in succession, the first test sequence including applying the test voltage having the first voltage to the output terminal of the complementary fuse and then stopping applying the test voltage, the second test sequence including applying the test voltage having the second voltage to the output terminal of the complementary fuse and then stop applying the test voltage; and
   the comparison circuit is configured to output the test result indicating a conforming item if a first comparison result obtained by comparing whether the output data coincides with the expected value after the test voltage stops being applied in the first test sequence and a second comparison result obtained by comparing whether the output data coincides with the expected value after the test voltage stops being applied in the second test sequence both indicate coincidence, and to output the test result indicating a defective item if the first or second comparison result indicates non-coincidence.

3. The semiconductor device according to claim 2, further comprising:

a first switch element that applies the first voltage to the first fuse; and a second switch element that applies the second voltage to the second fuse, wherein the test voltage application circuit is configured to turn both the first and second switch elements off while applying the test voltage.

4. The semiconductor device according to claim 2, wherein the comparison circuit is configured to detect a disconnection failure of the complementary fuse on the basis of whether the output data output from the complementary fuse in the first test sequence coincides with the output data output from the complementary fuse in the second test sequence.

5. The semiconductor device according to claim 1, further comprising:

a first switch element that applies the first voltage to the first fuse; and a second switch element that applies the second voltage to the second fuse, wherein the test voltage application circuit is configured to turn both the first and second switch elements off while applying the test voltage.

6. A test method of a semiconductor device, the semiconductor device including a complementary fuse that includes a first fuse to one end of which a first voltage is applied and the other end of which serves as an output terminal and a second fuse to one end of which a second voltage is applied and the other end of which is connected to the output terminal, the test method comprising:

performing a first test sequence and a second test sequence in succession, the first test sequence including applying a test voltage having the first voltage to the output terminal of the complementary fuse and then obtaining a first comparison result by comparing whether output data from the output terminal of the complementary fuse coincides with an expected value, the second test sequence including applying the test voltage having the second voltage to the output terminal of the complementary fuse and then obtaining a second comparison result by comparing whether the output data from the output terminal of the complementary fuse coincides with the expected value; and outputting a test result indicating a conforming item if the first comparison result and the second comparison result both indicate coincidence, and outputting the test result indicating a defective item if the first or second comparison result indicates non-coincidence.

7. The test method according to claim 6, wherein a disconnection failure of the complementary fuse is detected on the basis of whether the output data output from the complementary fuse in the first test sequence coincides with the output data output from the complementary fuse in the second test sequence.

* * * * *